US007452658B2

(12) United States Patent
De Silva et al.

(10) Patent No.: US 7,452,658 B2
(45) Date of Patent: Nov. 18, 2008

(54) MOLECULAR GLASS PHOTORESISTS

(75) Inventors: Ekmini Anuja De Silva, Ithaca, NY (US); Drew C. Forman, Ithaca, NY (US); Christopher K. Ober, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 11/355,643

(22) Filed: Feb. 16, 2006

(65) Prior Publication Data

US 2008/0044757 A1     Feb. 21, 2008

(51) Int. Cl.
*G03C 1/00* (2006.01)
(52) U.S. Cl. .................... 430/270.1; 430/311; 430/313; 430/322; 430/325
(58) Field of Classification Search .............. 430/270.1, 430/311, 313, 322, 325
See application file for complete search history.

(56) References Cited

OTHER PUBLICATIONS

"Lithography Based on Molecular Glasses", Journal of Photopolymer Science and Technology, vol. 18, No. 3, 2005, pp. 431-434.
"Adamantane Based Molecular Glass Resist for 193 nm Lithography", Shinji Tanaka and Christopher K. Ober. 12 pages.
"Materials for Future Lithography", Seung Wook Chang et al., Advances in Resist Technology and Processing XXII, Proceedings of SPIE, vol. 5753, 2005, pp. 1-9.
"Lithography Based on Calix[4]resorcinarene and Related Molecular Glasses", Seung Wook Chang et al , Materials Science and Engineering, Cornell University, School of Chemical and Biomolecular Engineering, Cornell University, 2 pages.
"Lithography at Short Wavelengths: New Strategies", Christopher K. Ober et al , Materials Science & Engineering, Cornell University, Bard Hall, Ithaca, NY, 1 page.
"New Strategies for Lithography at Short Wavelengths", Christopher K Ober et al , Materials Science and Engineering, Cornell University, Ithaca, NY, 1 page.
"Nanomolecular Resists with Adamantane Core for 193-nm Lithography", Jin-Baek Kim et al , Advances in Resist Technology and Processing XXII, Proceedings of SPIE 5753, 2005, pp. 603-610.
"Dry Etch Resistance of Organic Materials", H. Gokan et al., Basic Technol Res Lab., Nippon Electro. Co. Ltd., Journal of the Electrochemical Society, 1982, 1 page.
"Glass-Forming Binaphthyl Chromophores", Jacek C Ostrowski et al , Chem. Eur J 2001, 1, No. 20, pp. 4500-4511.
"Tridurylboranes Extended by Three Arylethynyl Groups as a New Family of Boron-Based π-Electron Systems", Shigehiro Yamaguchi et al , Institute for Chemical Research, Kyoto University, American Chemical Society, Organic Letters 2000, vol. 2, No. 26, pp. 4129-4132.
"Patterning Capabilities of EUV Resists", Wang Yueh, et al., Advances in Resists Technology and Processing XXI, Proceedings of SPIE, vol. 5376, 2004, pp. 434-442.
"Sources of Line Width Roughness for EUV Resists", Heido Cao, et al , Advances in Resists Technology and Processing XXI, Proceedings of SPIE, vol. 5376, 2004, pp. 757-764.
"Novel Class of Low Molecular-Weight Organic Resists for Nanometer Lithography", Motoko Yoshiiwa, et al., Appl. Phys. Lett. 69 (17), Oct. 1996, pp. 2605-2607.
"Vitrigens Part 2—Low Molecular Weight Organic Systems with High Glass Transition Temperatures", Alid D. Braun et al., J. Mater. Chem., 1998 8(4), pp. 847-851 A Tetrahedral Oligo(phenylenevinylene) Molecule of Intermediate Dimensions: Effect of Molecular Shape on the Morphology and Electroluminescence of Organic Glasses, Matthew R Robinson, et al , Adv. Funct. Mater. 2001, 11, No. 6, pp. 413-419.
"A Novel Family of Boron-C containing Hole-Blocking Amorphous Molecular Materials for Blue-and Blue-Violet-Emitting Organic Electroluminescent Devices", Motoi Kinoshita et al., Adv. Funct. Mater. 2002, 12, No. 11-12, pp. 780-786.
"Optimization of High-Performance Blue Organic Light-Emitting Diodes Containing Tetraphenylsilane Molecular Glass Materials", Li-Hsin Chan et al , J. Am. Chem Soc 2002, 124, pp. 6469-6479.
"Photo- and Electroactive Amorphous Molecular Material-Molecular Design, Syntheses, Reactions, Properties, and Applications", Yasuhiko Shirota, The Royal Society of Chemistry, 2005, 15, pp. 75-93.
"Charge-Transporting Molecular Glasses", Peter Strohriegl et al., Adv Mater 2002, 14, No. 20, 2002, pp. 1439-1452.
"Synthesis of Molecular 'Jacks': Rigid Tetrahedral Molecules with p-Phenylene Arms", Ladislav M. Wilson et al., J. Mater. Chem, 1993, vol. 3, pp. 991-994.
"Holesteric Liquid Crystals-New Materials for Holographic Applications", Ulrich Theissen et al , Adv. Mater. 2000, 12, No. 22, pp. 1698-1700.
"White Light Emission from Organic LEDs Utilizing Spiro Compounds with High-Temperature Stability", Frank Steuber et al., Adv. Mater. 2000, 12, No. 2, pp. 130-133.
"Methyl-substituted Derivates of 1,3,5-tris(diphenylamino)benzene as a Novel Class of Amorphous Molecular Materials", Ishikawa, Wataru et al., chemistry Letters, 1991, 1 page.
"Dendrimers with Thermally Labile End Groups: An Alternative Approach to Chemically Amplified Resists Materials Designed for Sib-100 nm Lithography", David C. Tully, et al., Adv. Mater. 2000, 12, No. 15, pp. 1118-1122.

(Continued)

*Primary Examiner*—Geraldina Visconti
(74) *Attorney, Agent, or Firm*—Miller, Matthias & Hull (57) ABSTRACT

Several small molecule, molecular glasses are disclosed with new architectures designed for use as photoresists in semiconductor lithography. The disclosed photoresists are low molecular weight organic materials that demonstrate a glass transition temperature significantly above room temperature as well as a low tendency towards crystallization. The molecular glass photoresists have a tetrahedral silane molecular core with four phenyl groups or four biphenyl groups. Each phenyl group or each outer phenyl group of a biphenyl group has a methoxy or hydroxy group at the 3- or 4-position. For the biphenyl embodiments, the linkage may be meta-meta, meta-para, para-para or para-meta.

9 Claims, 2 Drawing Sheets

OTHER PUBLICATIONS

"Synthesis, Spectroscopy, and Morphology of Tetrastilbenoidmethanes", Warren J. Oldham, Jr. et al., J. Am. Chem. Soc. 1998, 120, pp. 2987-2988.

"Novel Resists with Non-traditional Compositions for EUV Lithography", Junyan Dai et al., Advances in Resist Technology and Processing XXI, Proceedings of SPIE vol. 5376, 2004, pp. 508-5816.

"Silicon Backbone Polymers as EUV Resists", J., Pablo Bravo-Vasquez, et al., Advances in Resist Technology and Processing XXI, Proceedings of SPIE vol. 5376, 2004, pp. 739-745.

"Derivatives of Tetraphenylmethane and Tetraphenylsilane: Synthesis of new Tetrahedral Building Blocks for Molecular Construction", Jean-Hugues Fournier, et al., Can J. Chem , 81, 2003, pp. 376-380.

"A Positive-Working Alkaline Developable Photoresist Based on Partially tert-Boc-protected Calix[4]resorcinarene and Photoacid generator", Kwon Young-Gil et al., J. Mater. Chem 2002, 12, pp. 53-57.

"Synthesis and Properties of a Hole-Conducting, Photopatternable Molecular Glass", Thomas Fuhrmann et al., Chem. Mater. 1999, 11, pp. 2226-2232.

"Expanded Tetrahedral Molecules from 1, 3, 5, 7-Tetraphenyladamantane", Veronica R Reichert et al., Macromolecules 1994, 27, pp. 7015-7023.

"Synthesis, Morphology, and Optical Properties of Tetrahedral Oligo(phenylenevinylene) Materials", Shujun Wang et al., J. Am. Chem. Soc. 2000, 122, pp. 5695-5709.

Fig. 1: Absorption at EUV wavelength

Fig.2 Contrast curve for Tetrakis (3-hydroxyphenyl) silane with Powderlink™ crosslinker Fig.3 Contrast curve for Tetrakis (4-hydroxybiphenyl) silane (pp) with Powderlink™ crosslinker 200nm L/S
LER= 11.1nm Figure 4: Tetrakis (3-hydroxyphenyl) silane with Powderlink™ crosslinker

MOLECULAR GLASS PHOTORESISTS

BACKGROUND

1. Technical Field

Molecular glass photoresists are disclosed for use in semiconductor lithography processes. The disclosed molecular glass photoresists include a tetrahedral structure comprising a silicon core atom with $sp^3$ orbitals of the silicon core atom. The tetrahedral structure of the disclosed glass resists provides a diamond-like 3-D architecture, a glass transition temperature (Tg) well above room temperature and excellent glass forming properties without the need to incorporate Tg-suppressing aliphatic chains to prevent crystallinity.

2. Description of the Related Art

To meet the requirements for faster performance, integrated circuit devices continue to get smaller and smaller. The manufacture of integrated circuit devices with smaller features introduces new challenges in many of the fabrication processes conventionally used in semiconductor fabrication. One fabrication process that is particularly impacted is photolithography.

In semiconductor photolithography, photosensitive films in the form of photoresists are used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. With a negative-acting photoresist, the exposed coating layer portions polymerize or crosslink in a reaction between a photoactive compound and polymerizable reagents of the photoresist composition. Consequently, the exposed portions of the negative photoresist are rendered less soluble in a developer solution than unexposed portions. In contrast, with a positive-acting photoresist, the exposed portions are rendered more soluble in a developer solution while areas not exposed remain less soluble in the developer.

Chemically-amplified-type resists are used for the formation of sub-micron images and other high performance, smaller sized applications. Chemically-amplified photoresists may be negative-acting or positive-acting and generally include many crosslinking events (in the case of a negative-acting resist) or de-protection reactions (in the case of a positive-acting resist) per unit of photogenerated acid (PGA). In the case of positive chemically-amplified resists, certain cationic photoinitiators have been used to induce cleavage of certain "blocking" groups from a photoresist binder, or cleavage of certain groups that comprise a photoresist binder backbone. Upon cleavage of the blocking group through exposure of a chemically-amplified photoresist layer, a polar functional group is formed, e.g., carboxyl or imide, which results in different solubility characteristics in exposed and unexposed areas of the photoresist layer.

While suitable for many applications, currently available photoresists have significant shortcomings, particularly in high performance applications, such as formation of sub-half micron (<0.5 µm) and sub-quarter micron (<0.25 µm) patterns. Currently available photoresists are typically designed for imaging at relatively higher wavelengths, such as G-line (436 nm), I-line (365 nm) and KrF laser (248 nm) are generally unsuitable for imaging at short wavelengths such as sub-200 nm. Even shorter wavelength resists, such as those effective at 248 nm exposures, also are generally unsuitable for sub-200 nm exposures, such as 193 nm. For example, current photoresists can be highly opaque to short exposure wavelengths such as 193 nm, thereby resulting in poorly resolved images.

Compounding this problem is the inevitable fact that next generation lithography will resort to Extreme Ultraviolet (EUV) lithography. By utilizing extreme ultraviolet (EUV) radiation in the range of 4.5-15 nm, it is possible to produce features smaller than 0.18 µm. The resolution and therefore, the minimum feature size that can be obtained with EUV is a factor of 2-6 times better than with the present deep-UV or 193 nm lithography. However, as will be discussed below, other features of the projection lithography process have impeded the use of shorter wavelengths.

Unfortunately, most photoresist materials absorb extreme ultraviolet (EUV) radiation strongly in the range of 4.5-15 nm. While this is advantageous from the standpoint of resist speed (i.e. the exposure dose required to form a pattern) and the associated printing rate, it poses a serious problem for projection lithographic methods that employ EUV radiation because of highly nonuniform absorption of this radiation through the photoresist thickness. In present photoresist materials, EUV radiation will not penetrate much beyond a film thickness of 0.15 or 0.20 µm. Yet, to fabricate holes and other structures in semiconductor materials such as silicon, as well as metals, or dielectrics, the photoresist layer must be sufficiently thick, preferably in the range of 0.5-1.0 µm, to withstand etching and other processing steps.

Accordingly, in order to make use of the increased resolution afforded by the use of EUV radiation in the processing and fabrication of small structures, photoresists need to be developed that can be used in conjunction with high resolution EUV radiation and yet are compatible with conventional lithographic processing methods.

Therefore, with the impending widespread use of EUV lithography, new photoresists that satisfy the limitations inherent with EUV use are needed. Further, there is a need for new photoresists which can be used with EUV radiation and longer wavelength radiation sources as well.

SUMMARY OF THE DISCLOSURE

Several small molecule, molecular glasses are disclosed with new architectures designed for use as photoresists in semiconductor lithography processes. The disclosed amorphous molecular glass photoresists are low molecular weight organic materials that demonstrate a glass transition temperature significantly above room temperature as well as a low tendency towards crystallization.

Disclosed molecular glass photoresists can be selected from the following group consisting of:

tetrakis (3-methoxyphenyl) silane;

tetrakis (4-hydroxyphenyl) silane;

tetrakis (4-methoxyphenyl) silane;

tetrakis (3-hydroxyphenyl) silane;

tetrakis (3-hydroxy-3-biphenyl) silane tetrakis (4-hydroxy-3-biphenyl) silane;

tetrakis (4-hydroxy-4-biphenyl) silane;

tetrakis (3-hydroxy-4-biphenyl) silane;

tetrakis (3-methoxy-3-biphenyl) silane;

tetrakis (4-methoxy-3-biphenyl) silane;

tetrakis (3-methoxy-4-biphenyl) silane;

tetrakis (4-methoxy-4-biphenyl) silane;

and combinations thereof.

In a refinement, the photoresists are combined with a cross linker selected from the group consisting of tetramethoxymethyl glycoluril, methylpropyltetramethoxymethyl glycoluril, methylphenyltetramethoxymethyl glycoluril and combinations thereof.

In a refinement, transparency of the disclosed glasses at shorter wavelengths, such as the EUV wavelength of 13.4 nm, may be enhanced by incorporation of low absorbing atoms such as C, H and Si.

While particularly suitable for EUV lithography, the disclosed glass photoresists can be used with longer wavelength processes as well.

BRIEF DESCRIPTION OF THE DRAWINGS

The disclosed photoresists, synthetic methods and lithographic methods described in greater detail below in conjunction with the following figures, wherein.

It should be understood, of course, that this disclosure is not limited to the specific embodiments illustrated herein.

DETAILED DESCRIPTION OF THE PRESENTLY PREFERRED EMBODIMENTS

The disclosed molecular glass photoresists combine the beneficial aspects of small molecules along with many of the favorable aspects of polymers. The disclosed molecular glass photoresists have a well defined structure without poorly defined end group locations. The disclosed molecular glass photoresists can be purified using standard chromatographic techniques.

Unlike other small molecules, the unique glass forming properties of the disclosed molecular glass photoresists stem from an inability to crystallize. Thus, the disclosed molecules can be trapped in a kinetically stable amorphous state. Like polymers, the disclosed molecular glasses demonstrate glass transition temperatures (Tg) significantly higher than room temperature despite their modest molecular dimensions. The disclosed glass photoresists can be characterized by the disorder in both intermolecular distance and orientation and the presence of free volume. Unlike single crystals and liquid crystalline materials which show anisotropic properties, the disclosed molecular glass photoresists exhibit isotropic properties due the absence of grain boundaries.

The molecular shape defines molecular flexibility as well as the packing ability of various molecular systems. The disclosed glass photoresists have tetrahedral structures resulting from a silicon core atom and $sp^3$ orbitals of the silicon atom that enforce the tetrahedral shape. A persistent tetrahedral structure offers possibilities towards constructing a diamond-like 3-D architecture with promising glass forming properties without the need to incorporate Tg-suppressing aliphatic chains to prevent crystallinity. An exemplary tetrahedral ring structure and tetrakis(5-hydroxyphenyl)silane are shown below:

Tetrahedral Structure       Tetrakis(3-hydroxy phenyl)silane

Figure 1:
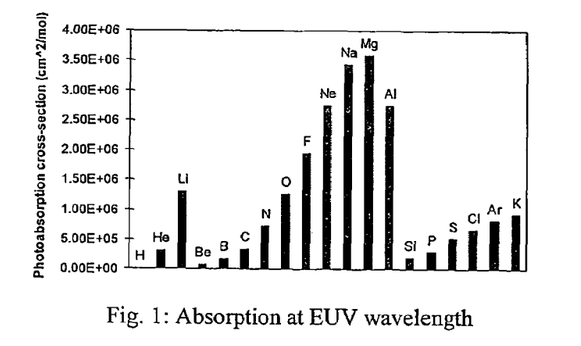
FIG. 1 graphically illustrates absorption of various elements at the EUV wavelength.

Because of the low power of some lithographic sources, high sensitivity is crucial. Therefore, low absorption coefficients ($A_o$) are desirable. Because shorter wavelength absorption depends not only on structure and density, but also, as indicated in FIG. 1, upon the inclusion of low absorbing atoms such as C, H, Si or B in the exposed material. Therefore, choosing the combination of atomic elements for the molecular composition in addition to the structural design can lower the $A_o$ of a material. The disclosed molecular glass photoresists maximize the incorporation of low absorbing atoms while decreasing the content of O and F atoms.

Materials

Bromoanisole (<98%), tetraethyl orthosilicate (98%), dibromobenzene (98%), butyllithium solution (2.5 M in hexanes), tetrakis(triphenylphosphine)palladium(0) (99%), boron tribromide solution (1.0 M in dichloromethane) purchased from Aldrich and used as received. Methoxyphenylboronic acid (97%) was obtained from TCI America and used as received. Anhydrous tetrahydrofuran (THF) was obtained from Aldrich; all other solvents were obtained from Fisher unless otherwise states.

Equipment

NMR spectra were recorded using a Mercury 300 Hz spectrometer. FTIR were obtained on a Mattson Instruments Galaxy 2020 FTIR. Thermogravimetric analysis (TGA) was accomplished under nitrogen using a TA Q500 and DSC data were collected with a TA Q1000, both employing a heating rate of 10° C. $\min^{-1}$. The second heating/cooling cycle was used for the calculation of $T_g$ values. Powder X-ray diffraction traces were recorded using a Sintag Theta-Theta diffractometer. Contrast curves were collected on a HTG contact aligner under a wavelength of 405 nm, with film thickness measured using a Tencor P10 Profileometer. E-beam lithography was carried out using Leica VB6, 100 kV high resolution lithography system. SEM images were obtained with a Zeiss Supra 55VP SEM.

Synthesis of Disclosed Molecular Glass Resists (1) Tetrakis (3-methoxyphenyl) silane Tetrakis (3-methoxyphenyl) silane Through modifying a synthetic procedure first reported by Wuest et al., Can. J.Chem. 81, 2003, 376-380, a more facile synthesis was developed. 3-Bromo anisole (10 g, 0.053 mols) was dissolved in 100 ml of anhydrous THF, then stirred at −78° C. under dry $N_2$ and treated dropwise with a solution of butyllithium solution (21.5 ml, 2.5M in hexanes, 0.053 mols). The resulting mixture was kept at −78° C. for 30 min, and then tetraethyl orthosilicate (3 ml, 0.0134 mol) was added. The mixture was stirred overnight while the temperature was allowed to rise to 25° C. Then, water was added, and the product was extracted multiple times with ether. The combined extracts were washed with water and NaCl and dried over MgSO4 and filtered. Volatiles were removed by rotary evaporation. The product was purified through column chromatography with chloroform as solvent. The product was obtained as a white solid with 58% yield. 1 H NMR (CDCl$_3$) 3.82 ppm 12 H S, 6.92 ppm (CH aromatic), 6.94 ppm (CH aromatic), 7.3 ppm (CH aromatic),7.4 ppm (CH aromatic).

(2) Tetrakis (3-hydroxyphenyl) silane

Tetrakis (3-hydroxyphenyl) silane

To a solution of tetrakis (3-methoxyphenyl) silane (4.5 g, 0.001 mol) in CH$_2$Cl$_2$ (80 ml) was added BBr$_3$ (50 ml of 1M CH$_2$Cl$_2$ solution) dropwise at −78° C. The mixture was allowed to room temperature and stirred overnight. The reaction mixture was poured into 2N NaOH 50 ml), and extracted with CH$_2$Cl$_2$. The aqueous layer was acidified with 5N HCl, and extracted with ethyl acetate. The organic layer was dried with MgSO$_4$ and evaporated to give brown solid. Yield 95%. 1 H NMR (acetone) 6.95 ppm (CH aromatic), 6.98 ppm (CH aromatic), 7.2 ppm (CH aromatic), 7.4 ppm (CH aromatic), 8.4 (OH). IR (NaCl plate) 3300 cm$^{-1}$, 3600 cm$^{-1}$ (O—H).

(3) Tetrakis (4-methoxybiphenyl) silane

Tetrakis (4-methoxy biphenyl) silane

Tetrakis (3-bromophenyl) silane (3 g, 0.0046 mol), 4-methoxy phenyl boronic acid (3 g, 0.02 mmol), and Pd(PPh$_3$)$_4$ (1.1 g, 0.001 mol) were dissolved in de-oxygenated 100 ml THF under a N$_2$ purge. A solution of de-oxygenated 2M Na$_2$CO$_3$ (20 ml) was added and the resulting mixture was refluxed for 48 hrs. The product then was extracted with ethyl acetate and purified through a CH$_2$Cl$_2$:Hexane (1:1) column. A white solid was obtained. Yield 52%. 1 H NMR (CDCl$_3$) 3.82 ppm 12 H S, 6.88 ppm (CH aromatic), 6.90 ppm (CH aromatic) 7.41 ppm (CH aromatic), 7.43 ppm (CH aromatic), 7.58 ppm (CH aromatic), 7.85 ppm (CH aromatic).

(4) Tetrakis (4-hydroxybiphenyl) silane

Tetrakis (4-hydroxybiphenyl) silane

To a solution of tetrakis (4-methoxybiphenyl) silane (2 g, 0.0026 mol) in CH$_2$Cl$_2$ (80 ml) was added BBr$_3$ (15 ml of 1M CH$_2$Cl$_2$ solution) dropwise at −78° C. The mixture was allowed to room temperature and stirred overnight. The reaction mixture was poured into 2N NaOH (50 ml), and extracted with CH$_2$Cl$_2$. The aqueous layer was acidified with 5N HCl, and extracted with ethyl acetate. The organic layer was dried with MgSO$_4$ and evaporated to give brown solid. Yield 93%. 1 NMR (CDCl$_3$) 6.87 ppm (CH aromatic), 6.89 ppm (CH aromatic) 7.43 ppm (CH aromatic), 7.63 ppm (CH aromatic) 7.71 ppm (CH aromatic), 7.95 ppm (CH aromatic), 8.2 ppm (OH). IR (NaCl plate) 3250 cm$^{-1}$, 3300 cm$^{-1}$ (O—H).

Structural changes can be introduced through different cores, arms lengths and isomeric changes in arms and still clearly fall within the scope of this disclosure. Silicon was selected as core because it provides enhanced transparency at EUV wavelength, has superior etch resistance and provides synthetic versatility. In addition to silicon, other cores such as carbon, admantane may also be used to synthesize tetrahedral amorphous materials. For a family of related compounds, properties such as glass transition (Tg) and crystallinity are determined by the specific core employed, but precisely how the inner core influences these properties is yet to be completely understood.

As shown above, the disclosed hydroxyl phenyl silane compounds can be obtained through a facile synthesis with reasonable yields. These amorphous materials can be acquired through solvent evaporation and vacuum drying. Glass forming properties of these materials can be evaluated by measuring their glass transition temperatures and the ability to form amorphous thin films. Different isomers of the tetrakis (n-hydroxy phenyl) silane system were synthesized from the respective n-bromoanisoles according to reported procedures. Unlike tetraphenyl silane, the incorporation of a polar hydroxyl group introduces some amorphous character to these molecules. This system illustrates how Tg can be altered through different positions of the hydroxyl group.

Tetrakis (4-hydroxy phenyl) silane; Tg=274-278 deg. C.

Tetrakis (5-hydroxy phenyl) silane; Tg=15 deg. C.

Tetrakis (6-hydroxy phenyl) silane; Tg=2 deg. C.

As shown above, having the hydroxyl group placed in the ortho or meta positions prevent ordering of molecules which yields sufficient free volume to decrease the Tg significantly below room temperature. The para hydroxy group allows ordered crystalline packing with a high melting temperature. Various other substituents in the para position have yielded crystalline phenyl silane derivatives as well. Thus, for tetrakis (n-hydroxyphenyl) silanes, tetrakis (3-hydroxyphenyl) silane, tetrakis (4-hydroxyphenyl) silane, and tetrakis (5-hydroxyphenyl) silane are preferred and tetrakis (4-hydroxyphenyl) silane is the most preferred of this sub-group based on glass transition temperature.

As photoresists require high Tgs to enable processing at high temperatures, an improvement of this molecular structure was necessary. Hence, the system was made more rigid through the integration of stiff biphenyl links that can decrease molecular flexibility. Three isomers were formed by changing the position of the biphenyl link and the hydroxyl group. The Tg values demonstrate that the meta-meta linkage is too flexible while the para-para link is prone towards crystallization. The intermediate meta-para link finds a balance between molecular mobility and packing. One disclosed strategy for increasing Tg and preventing crystallization is to incorporate methyl substituents that may prevent rotation about the Si—C bond. This approach has been used to prevent ordered packing of the para-para biphenyl silane derivatives and form an amorphous molecule with a Tg of 70° C. The XRD patterns show amorphous halos in support of the amorphous nature of these materials. These biphenyl structures can be spin cast from a solvent (usually PGMEA) in order to form stable amorphous films.

Tetrakis(3-hydroxy-3-biphenyl)silane, Tg=25 deg C.

Tetrakis(4-hydroxy-3-biphenyl)silane, Tg=60 deg. C.

Tetrakis(4-hydroxy biphenyl)silane, Tg=125 deg.C., Tm=145 deg. C.

Thus, for the sub-group of tetrakis(n-hydroxy-n-biphenyl) silanes, the para-para and meta-para combinations (tetrakis (3-hydroxy biphenyl)silane and tetrakis(4-hydroxy biphenyl) silane are preferred.

As silicon outgassing could result in damage to expensive optics in the EUV tool, adding silicon to a resist system must be carefully considered. Another consequence of silicon outgassing could be the shrinkage of the already thin resist films. Hence, incorporating silicon as the core is expected to be more suitable than a more freely accessible pendent group. Another advantage of incorporating silicon atoms has been demonstrated in the lower absorbance coefficients of silicon containing polymeric resists. As absorbance at the EUV wavelength depends only on atomic composition and density, silicon containing molecular glasses too, demonstrate lower absorption coefficients below 1.5 μm$^{-1}$ as shown below for tetrakis(3-hydroxy phenyl) silane and tetrakis(4-hydroxy-3-biphenyl)silane respectively:

The use of protecting groups such as t-buoy carbonyl for the phenol groups the tetrahedral structures too flexible and produced too low Tgs. Thus hydroxyl or metonym groups on the outer phenyl groups are preferred, and at the 3 or 4 position as discussed above.

The disclosed molecular glasses were used as negative tone photoresists with the addition of a commercially available cross linker. Preferred crosslinking agents include tetramethoxymethyl glycoluril, methylpropyltetramethoxymethyl glycoluril, and methylphenyltetramethoxymethyl glycoluril, all sold under the trademark Powderlink® by Cytec Technology Corporation (http://www.cytec.com/). Combinations of two or more of these crosslinking agents may also be used.

Upon exposure to UV or electron beam radiation, crosslinking between the multifunctional cross linker and the hydroxyl groups of the photoresist, catalyzed by the photo acid generator, resulted in a robust cross linked network that does not dissolve in aqueous base. Contrast curves were conducted using HTG contact aligner with a wave length of 405 nm to evaluate the lithographic performance of the resist systems. The contrast curves are shown in FIGS. 2 and 3.

Figure 2:
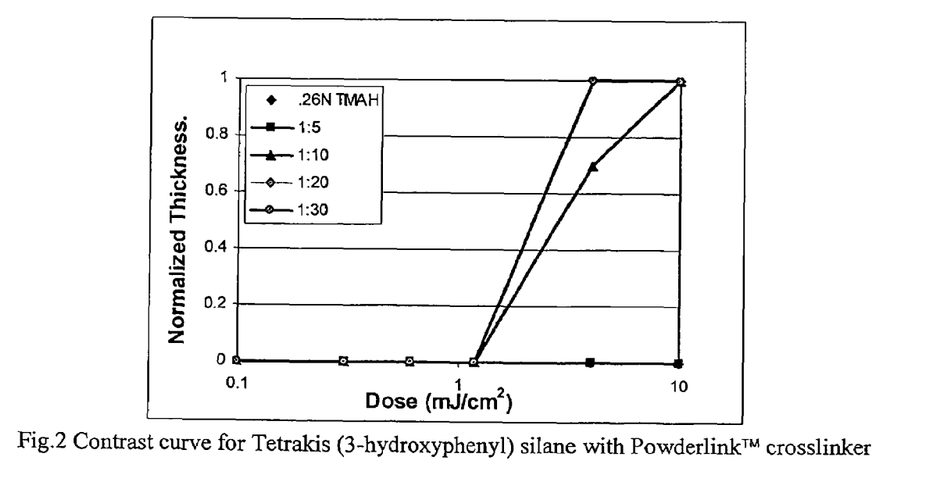
FIG. 2 graphically illustrates normalized thickness as a function of the radiation dose at a wavelength of 405 nm for tetrakis (3-hydroxyphenyl) silane with Powderlink™ cross linker as an additive.
Figure 3:
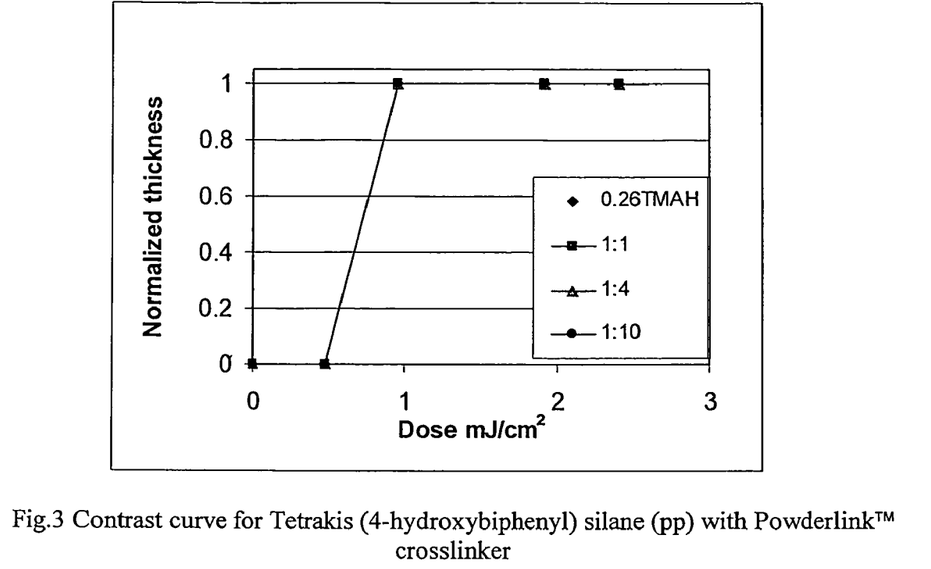
FIG. 3 graphically illustrates normalized thickness as a function of the radiation dose at a wavelength of 405 nm for tetrakis (4-hydroxyphenyl) silane with Powderlink™ cross linker as an additive.
Figure 4:
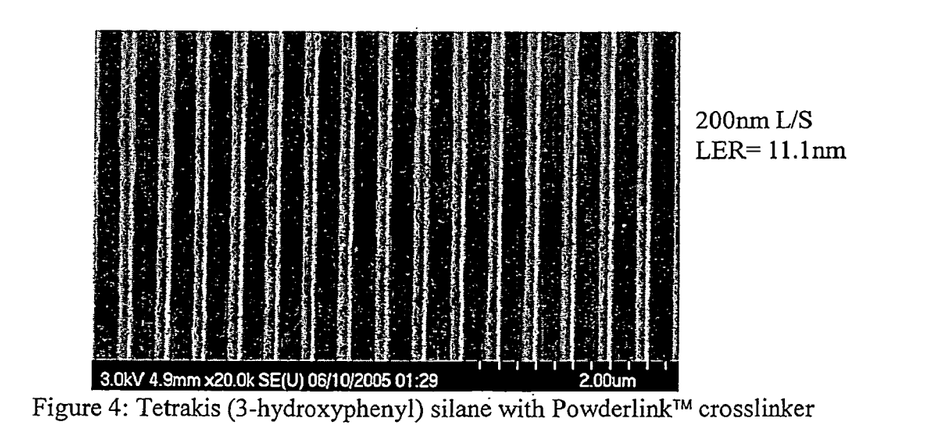
FIG. 4 is a SEM photograph illustrating a 200 nm L/S pattern of tetrakis (3-hydroxyphenyl) silane with Powderlink™ cross linker of FIG. 2.

As shown in FIGS. 2 and 3, both systems demonstrate good sensitivities in the 1-1.2 mJ/cm$^2$ and can be developed in a range of aqueous base concentrations. The high sensitivity could be due to the efficient o-alkylating crosslinking reaction between the phenolic resist moieties and the crosslinking agent. The silane based molecular glasses are being further evaluated through e-beam lithography. The SEM photograph of FIG. 4 shows a 200 nm L/S pattern of the tetrakis (3-hydroxy phenyl) silane with Powderlink™ cross linker system as shown in FIG. 2.

Accordingly, molecular glass photoresists are disclosed that incorporate silicon atoms for favorable resist performance at EUV wavelength. The Tg can be tuned with various isomeric features and incorporation of rigid links. The performance of the disclosed molecular glass photoresists was tested through lithographic evaluation. The disclosed tetrahedral molecular design provides opportunities for a better understanding of molecular glass construction.

The foregoing description of the invention is merely illustrative thereof, and it is understood that variations and modification can be made without departing from the spirit of scope of the invention as set forth in the following claims. Further possibilities of structure modifications and process conditions will be apparent to those skilled in the art.

The invention claimed is:

1. A photoresist for use in lithographic processes, the photoresist comprising:
    a tetrahedral silane molecule comprising a silicon center atom, and four substituted phenyl groups, each substituted phenyl group attached to the silicon center atom, each substituted phenyl group comprising either a first substituent at the 3-position or a second substituent at the 4-position,
    wherein the first substituents are selected from the group consisting of hydroxy, methoxy, 3-hydroxy phenyl, 4-hydroxy phenyl, 3-methoxy phenyl, 4-methoxy phenyl, and combinations thereof, and
    wherein the second substituents are selected from the group consisting of methoxy, 3-hydroxy phenyl, 4-hydroxy phenyl, 3-methoxy phenyl, 4-methoxy phenyl, and combinations thereof.

2. The photoresist of claim 1 wherein the photoresist is an amorphous molecular glass having a glass transition temperature (Tg) that is greater than room temperature.

3. The photoresist of claim 1 further comprising a cross linker selected from the group consisting of tetramethoxymethyl glycoluril, ethylpropyltetramethoxymethyl glycoluril, methylphenyltetramethoxymethyl glycoluril and combinations thereof.

4. A process for forming a photoresist pattern, said process comprising:
    coating a photoresist of claim 1 on a semiconductor substrate to form a photoresist film;
    exposing the photoresist film using a exposing device; and
    developing the photoresist film.

5. The process of claim 4 wherein the exposing device is an EUV source.

6. The process of claim 5 wherein the energy of the EUV source ranges from about 1 to about 1.2 $mJ/cm^2$.

7. A semiconductor element manufactured by the process of the claim 4.

8. A photoresist comprising:
    a molecular glass selected from the group consisting of:
        tetrakis (3-methoxyphenyl) silane;
        tetrakis (4-methoxyphenyl) silane;
        tetrakis (3-hydroxyphenyl) silane;
        tetrakis (3-hydroxy-3-biphenyl) silane;
        tetrakis (4-hydroxy-3-biphenyl) silane;
        tetrakis (3-hydroxy-4-biphenyl) silane;
        tetrakis (4-hydroxy-4-biphenyl) silane;
        tetrakis (3-methoxy-3-biphenyl) silane;
        tetrakis (4-methoxy-3-biphenyl) silane;
        tetrakis (3-methoxy-4-biphenyl) silane;
        tetrakis (4-methoxy-4-biphenyl) silane; and
        combinations thereof.

9. The photoresist of claim 8 further comprising a cross linker selected from the group consisting of tetramethoxymethyl glycoluril, methylpropyltetramethoxymethyl glycoluril, methylphenyltetramethoxymethyl glycoluril and combinations thereof.

* * * * *